US010932395B2

(12) United States Patent
Yen et al.

(10) Patent No.: US 10,932,395 B2
(45) Date of Patent: Feb. 23, 2021

(54) THERMAL MANAGEMENT DEVICE FOR USE ON ELECTRONICS IN A TRANSPORTATION VEHICLE

(71) Applicant: GM Global Technology Operations LLC, Detroit, MI (US)

(72) Inventors: Chih-hung Yen, Bloomfield Hills, MI (US); Daniel R. Gee, Novi, MI (US); Brennon L. White, Novi, MI (US); John M. Kuehnel, Sterling Heights, MI (US); Adam J. Campbell, Rochester, MI (US); Richard J. Skurkis, Lake Orion, MI (US); Paul E. Krajewski, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 305 days.

(21) Appl. No.: 15/997,016

(22) Filed: Jun. 4, 2018

(65) Prior Publication Data
US 2019/0373771 A1  Dec. 5, 2019

(51) Int. Cl.
*H05K 7/20* (2006.01)
*F28D 15/04* (2006.01)
(Continued)

(52) U.S. Cl.
CPC ......... *H05K 7/20881* (2013.01); *G06F 1/206* (2013.01); *H01L 23/367* (2013.01);
(Continued)

(58) Field of Classification Search
CPC . H05K 7/2029; H05K 7/20309–20318; H05K 7/20881; G06F 1/20–203
(Continued)

(56) References Cited

U.S. PATENT DOCUMENTS 5,937,936 A * 8/1999 Furukawa ........... F28D 15/0233
165/104.33
6,201,699 B1 * 3/2001 Ayres .................... H01L 23/367
174/16.3
(Continued)

FOREIGN PATENT DOCUMENTS

| CN | 204085272 U | 1/2015 |
| CN | 106050425 A | 10/2016 |
| CN | 106793671 A | 5/2017 |

OTHER PUBLICATIONS

First Office Action for Chinese Application No. 201910370407.6 dated Apr. 10, 2020; 7 pages.
(Continued)

*Primary Examiner* — Zachary Pape (57) ABSTRACT

A thermal management device for dissipating heat from an electrical component includes a volume of working fluid configured to change from a liquid state to a vapor state in response to being heated by the electrical component. The thermal management device also includes a working fluid chamber configured to move the working fluid. The working fluid chamber includes an impermeable outer portion and a porous inner portion integrally formed with and connected to the impermeable outer portion. The inner portion is configured to move the working fluid when in the liquid state toward the electrical component. The impermeable outer portion is made of a first material and the porous inner portion is made of a second material. The first material is different from the second material.

20 Claims, 8 Drawing Sheets

(51) Int. Cl.
  *H01L 23/367*   (2006.01)
  *G06F 1/20*     (2006.01)
  *H01L 23/427*   (2006.01)

(52) U.S. Cl.
  CPC ....... *H01L 23/427* (2013.01); *H05K 7/20309* (2013.01); *H05K 7/20318* (2013.01); *H05K 7/20381* (2013.01)

(58) Field of Classification Search
  USPC .......................................... 361/700, 679.52
  See application file for complete search history.

(56) References Cited

U.S. PATENT DOCUMENTS

| | | | | |
|---|---|---|---|---|
| 6,490,160 | B2* | 12/2002 | Dibene, II | G06F 1/18 165/104.26 |
| 8,844,877 | B1* | 9/2014 | Driemeyer | B64C 1/38 244/171.7 |
| 2005/0173098 | A1* | 8/2005 | Connors | F28D 15/0233 165/104.33 |
| 2008/0174963 | A1* | 7/2008 | Chang | F28D 15/046 361/700 |
| 2013/0126132 | A1* | 5/2013 | Chen | F28D 15/046 165/104.26 |
| 2016/0091257 | A1* | 3/2016 | Minx | F25B 39/02 165/104.21 |

OTHER PUBLICATIONS

Second Office Action for Chinese Application No. 201910370407.6 dated Sep. 4, 2020; 7 pages.

\* cited by examiner

THERMAL MANAGEMENT DEVICE FOR USE ON ELECTRONICS IN A TRANSPORTATION VEHICLE

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to a thermal management device for use on electronics in a transportation vehicle.

Additive manufacturing is the manufacture of components by adding material and/or joining materials or elements rather than by removing material as is typically done in conventional manufacturing processes such as machining or milling. One process used in additive manufacturing is 3-dimensional (3D) printing. In a 3D printing process, multiple layers of material are added to one another to construct a 3-dimensional object. Additive manufacturing can be used in a wide range of industries, including the automotive industry.

Additive manufacturing can be applied to many systems in a vehicle such as the electrical systems. The electrical systems of modern vehicles are becoming increasingly complex and are requiring increasing levels of electrical power to energize the various electrical components. Such electrical components often generate heat during operation. Thermal management devices are needed to dissipate the heat generated by the electrical components.

SUMMARY

In one example in accordance with the present disclosure, a thermal management device for dissipating heat from an electrical component includes a volume of working fluid configured to change from a liquid state to a vapor state in response to being heated by the electrical component. The thermal management device also includes a working fluid chamber configured to move the working fluid. The working fluid chamber includes an impermeable outer portion and a porous inner portion integrally formed with and connected to the impermeable outer portion. The inner portion is configured to move the working fluid when in the liquid state toward the electrical component. The impermeable outer portion is made of a first material and the porous inner portion is made of a second material. The first material is different from the second material.

In one aspect, the thermal management device includes an evaporator connected to the working fluid chamber. At least a portion of the evaporator is formed from a thermally conductive material with greater thermal conductivity than the first material. The evaporator is configured to thermally conduct heat from the electrical component to the working fluid.

In one aspect, the evaporator includes an evaporator wall defining an evaporator cavity and the evaporator cavity is in fluid communication with the working fluid chamber.

In one aspect, the thermally conductive material is a different material than the first material and the second material.

In one aspect, the working fluid chamber extends away from the evaporator.

In one aspect, the thermal management device includes a condenser. The condenser is integrally formed with and connected to the working fluid chamber and is configured to transfer heat from the working fluid to an environment.

In one aspect, the condenser includes a condenser wall in contact with the working fluid. The condenser wall includes a plurality of projections in contact with the working fluid. The plurality of projections are configured to increase a rate at which the working fluid condenses from the vapor state to the liquid state when the working fluid contacts the plurality of projections.

In one aspect, the working fluid chamber has an arcuate shape radiating outward from a center portion.

In one aspect, the thermal management device includes a plurality of working fluid chambers. Each working fluid chamber of the plurality of working fluid chambers includes an impermeable outer portion including an inner surface that defines at least a portion of an inner cavity inside the working fluid chamber and a porous inner portion integrally formed with and connected to the impermeable outer portion. The inner portion is configured to move the working fluid when in the liquid state toward a thermally conductive evaporator.

In one aspect, each working fluid chamber of the plurality of working fluid chambers has an arcuate shape and radiates outward from a center portion.

In one aspect, the thermal management device includes a plurality of connecting surfaces that are connected between the plurality of working fluid chambers.

In one aspect, the plurality of connecting fins are integrally formed with the plurality of working fluid chambers.

In one aspect, each working fluid chamber of the plurality of working fluid chambers has a linear shape and radiates outward from a circular center portion.

In one aspect, the thermal management device includes a plurality of ribs. Each rib of the plurality of ribs is associated with one working fluid chamber of the plurality of working fluid chambers and projects upward from a top surface of the working fluid chamber. The plurality of ribs is configured to stiffen the plurality of working fluid chambers.

In one aspect, the thermal management device includes at least one support leg connected to the working fluid chamber. The at least one support leg is configured to connect the thermal management device to a cover of an electrical component housing.

In one aspect, the working fluid chamber is integrally formed with a cover of an electrical component housing.

In another example in accordance with the present disclosure, a thermal management device for dissipating heat from an electrical component of a vehicle includes a center portion configured to hold a volume of working fluid and to conduct heat from the electrical component into the working fluid. The thermal management device also includes a plurality of working fluid chambers projecting outward from the center portion. The plurality of working fluid chambers each include a funneling surface angled downwardly toward the center portion to cause the working fluid to flow toward the center portion after the working fluid condensates into a liquid in the plurality of working fluid chambers and a porous wicking portion positioned inside each working fluid chamber. The porous wicking portion is configured to cause the working fluid to move toward the center portion after the working fluid condensates into the liquid in the working fluid chamber. The funneling surface and the porous wicking portion are integrally formed in one or more walls of each working fluid chamber of the plurality of working fluid chambers and are made of different materials.

In one aspect, at least part of the center portion is made of a metallic material and is integrally formed with the plurality of working fluid chambers.

In one aspect, the porous wicking portion is made of a material that includes a plurality of channels therein that wick the working fluid toward the center portion.

In one aspect, the thermal management device includes a plurality of fins connected to a distal end of each working fluid chamber of the plurality of working fluid chambers. The distal end of each working fluid chamber is located at an end of the working fluid chamber away from the center portion.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Various electrical components are contained in a vehicle such as power supplies, processing devices, control systems, climate control systems, safety systems, entertainment systems, autonomous driving systems, fuel delivery systems, electric motors and the like. Such electrical components generate heat during operation. A thermal management device of the present disclosure is connected to or is integrated into one such electrical component to dissipate the heat generated by the electrical component during operation.

The thermal management devices of the present disclosure are formed using an additive manufacturing process that enables the thermal management devices to be integrally formed using multiple different materials that have advantageous properties to assist in dissipating heat from the electrical components. In one example, the thermal management device includes a volume of working fluid that is contained inside the thermal management device. The working fluid undergoes a phase change inside the thermal management device. The working fluid changes from a liquid state to a vapor state when the working fluid is heated by the heat generated from the electrical component. The working fluid further undergoes a phase change from the vapor state to the liquid state when the working fluid condensates inside the thermal management device. The condenser releases heat to the environment. Such repeated phase changes dissipate heat from electrical components more quickly and effectively than electrical components without the thermal management devices of the present disclosure.

One example thermal management device includes a working fluid chamber that holds the working fluid. The thermal management device includes an impermeable outer portion used to retain the working fluid. The impermeable outer portion defines an inner cavity in which the working fluid undergoes the one or more previously described phase changes. The working fluid chamber also includes a porous inner portion that includes one or more pores (or inner channels) that wick the working fluid from a condenser toward an evaporator of the thermal management device. The condenser transfers heat from the working fluid to the environment as the working fluid changes from the vapor phase to the liquid phase. The evaporator of the thermal management device conducts heat from the electrical component to the working fluid to cause the working fluid to change to the vapor phase from the liquid phase. The phase changes and the movement of the working fluid through the working fluid chamber causes the thermal management device to dissipate heat from the electrical component of the vehicle.

The thermal management devices of the present disclosure are formed using additive manufacturing techniques. The impermeable outer portion, the porous inner portion as well as the evaporator and/or the condenser are integrally formed as an integrated thermal management device using different materials. In addition, the various portions of the thermal management device can have unique surface properties or surface textures that advantageously and efficiently improve the phase changes of the working fluid and/or improve the movement of the working fluid through the working fluid chamber and between the evaporator and the condenser.

While the examples provided herein discuss use of the thermal management device in connection with the electrical components of a vehicle, the thermal management devices of the present disclosure can also be used to dissipate and/or transfer heat in other applications. For example, the thermal management devices of the present disclosure can also be used in computer and/or server environments, consumer electronics, manufacturing assemblies, power generation equipment, health care electronics, automation equipment, aircraft equipment, marine equipment, and others.

Figure 1:
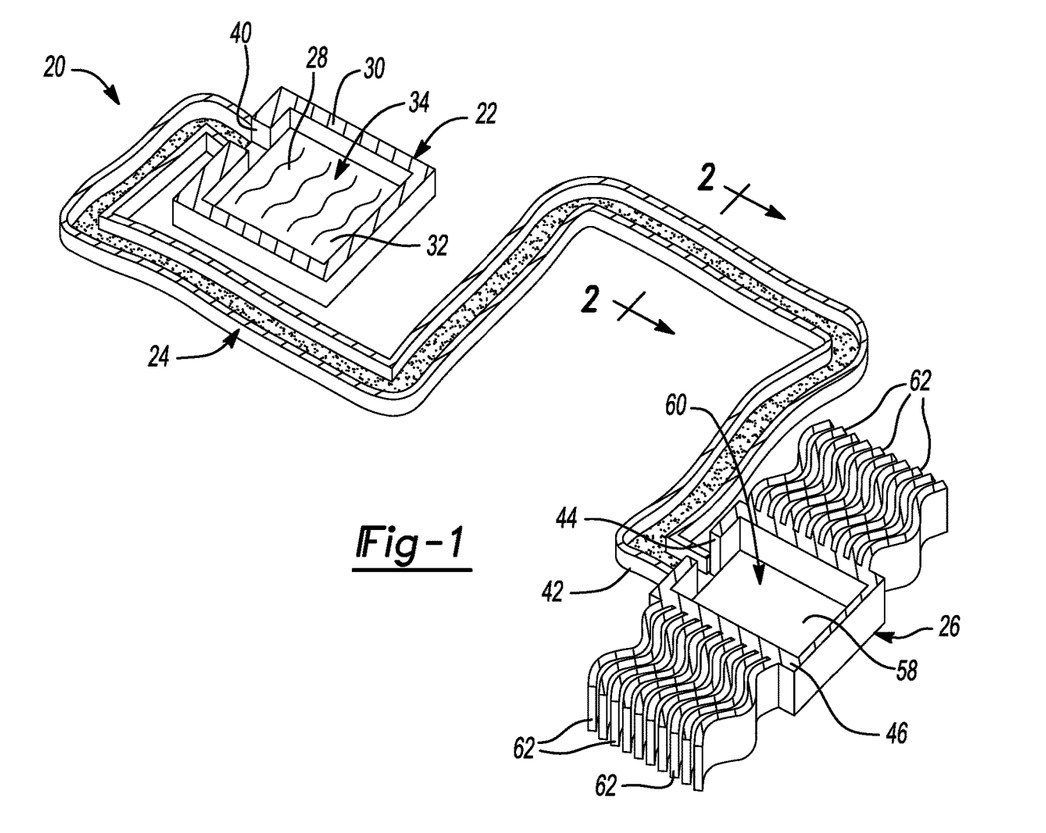
FIG. 1 is a perspective view of an example thermal management device in accordance with the present disclosure.
Figure 2:
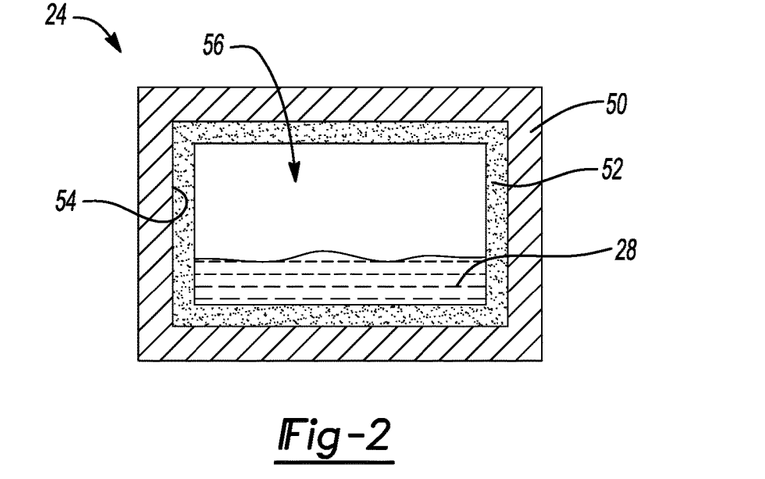
FIG. 2 is a cross-sectional view of a working fluid chamber of the thermal management device of FIG. 1.
Figure 3:
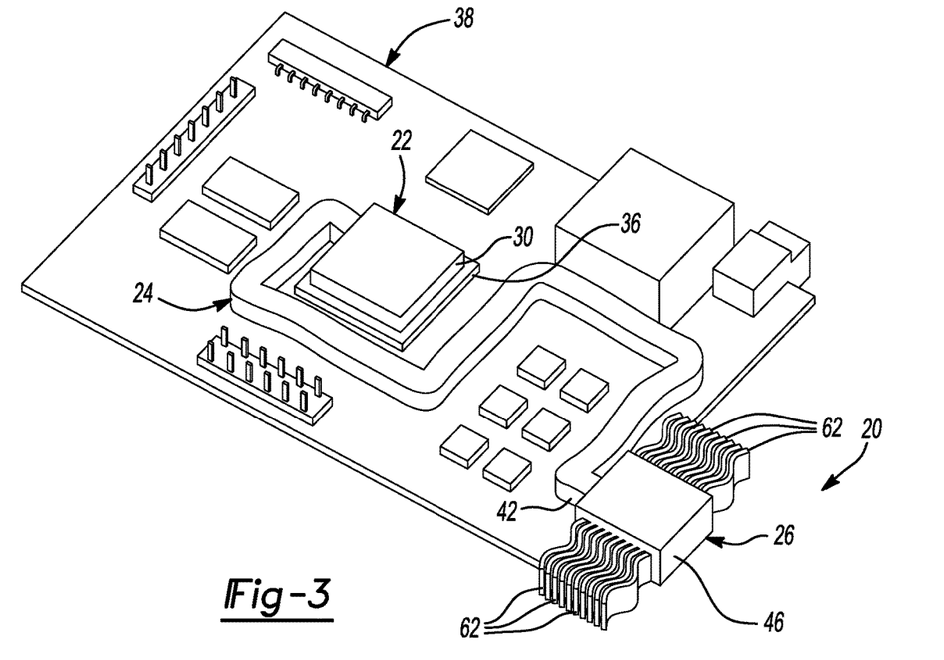
FIG. 3 is a perspective view of the thermal management device of FIG. 1 on an electrical component.

Referring now to FIGS. 1-3, an example thermal management device 20 includes an evaporator 22, a working fluid chamber 24 and a condenser 26. The thermal management device 20 is a closed system that contains a volume of working fluid 28 (FIG. 2). The thermal management device 20 is a closed system that prevents the working fluid 28 from escaping from the thermal management device 20 as the working fluid 28 undergoes phase changes and/or moves between the elements of the thermal management device 20, as will be described. The thermal management device 20 is positioned in thermal communication with an electronic component. In the example shown in FIG. 3, the thermal management device 20 is positioned in thermal communication with a processor 36 of the electrical component 38.

The evaporator 22 is a portion of the thermal management device 20 that conducts heat from an electronic component to a working fluid 28 contained inside the thermal management device 20. In the example shown, the evaporator 22 includes an evaporator wall 30 and an evaporator base 32. The evaporator wall 30 projects upwards from the evaporator base 32 and defines an evaporator cavity 34. The evaporator base 32 is made of a suitable material to conduct heat from the electrical component 38 and to heat the working fluid 28. In one example, the evaporator base 32 is made of a copper material or other suitable metallic material. The evaporator wall 30 is made of a material different from the evaporator base 32. In the example shown, the evaporator wall 30 is made of an impermeable plastic material, such as acrylonitrile butadiene styrene (ABS), nylon, high-density polyethylene (HDPE), or the like. In other examples, other suitable impermeable materials can be used or the evaporator wall 30 can be made of the same material as the evaporator base 32.

The working fluid chamber 24 is fluidly connected between the evaporator 22 and the condenser 26. In this position, the working fluid 28 moves through the working fluid chamber 24 between the evaporator 22 and the condenser 26. The working fluid chamber 24 is fluidly connected to the evaporator 22 at an evaporator opening 40. The evaporator opening 40 is an opening in the evaporator wall 30 that permits the working fluid 28 to move out of the evaporator 22 or back into the evaporator 22. At a second end 42 of the working fluid chamber 24, the working fluid chamber 24 is fluidly connected to the condenser 26 at a condenser opening 44. The condenser opening 44 is an opening in a condenser wall 46 of the condenser 26. The working fluid 28 can move from the working fluid chamber 24 and into (or back out of) the condenser 26 through the condenser opening 44.

As shown in FIG. 2, the working fluid chamber 24 includes an outer portion 50 and an inner portion 52. As shown in this example, the inner portion 52 is continuous and surrounds an inner surface 54 of the outer portion 50. In other examples, the inner portion 52 may only be present on one or more inner sides of the outer portion 50. The outer portion 50 of the working fluid chamber 24 is made of an impermeable material that prevents the working fluid 28 from escaping from the working fluid chamber 24. In one example, the outer portion 50 is made of an impermeable plastic material, such as acrylonitrile butadiene styrene (ABS), nylon, high-density polyethylene (HDPE), or the like. In other examples, other suitable impermeable materials can be used.

The inner portion 52 is integrally formed adjacent to an inner surface 54 of the outer portion 50. The inner portion 52 is made of a porous material that enables the working fluid 28 to be wicked through the inner portion 52 when the working fluid 28 is in a liquid phase. This property of the porous material of the inner portion 52 causes the working fluid 28 to move toward the evaporator 22 when the working fluid 28 condenses to the liquid phase. Any suitable porous material can be used to form the inner portion 52 during the additive manufacturing process. In one example, the inner portion 52 is made of a plastic or metallic material and is deposited in such a manner to create pores or channels that extend longitudinally through the inner portion 52 in a direction from the condenser 26 to the evaporator 22. As can be appreciated, such a structure of the porous inner portion 52 causes the working fluid 28 in the liquid phase to move in a direction through the inner portion 52 from the condenser 26 to the evaporator 22 due to capillary pressure and/or wicking properties. In other examples, a suitable porous material is used that, when deposited using an additive manufacturing process, has a suitable porous microstructure that wicks the liquid working fluid 28 in a direction toward the evaporator 22.

The working fluid chamber 24 has a continuous cross-section. The porous inner portion 52 is positioned inside the impermeable outer portion 50. In this configuration, the inner portion 52 and/or the outer portion 50 defines an inner cavity 56 that extends through the working fluid chamber 24 along its length. With this configuration, the working fluid chamber 24 provides a path for the working fluid 28 (in the vapor phase) to move between the evaporator 22 and the condenser 26. The working fluid 28 changes to the vapor state in response to being heated in the evaporator 22. The vaporized working fluid 28 moves through the working fluid chamber 24 through the inner cavity 56 that is defined by the inner portion 52 and/or the outer portion 50. After the vaporized working fluid 28 condenses into a liquid at or near the condenser 26, the liquid working fluid 28 moves through the working fluid chamber 24 back to the evaporator 22 through the porous inner portion 52. The porous inner portion 52 wicks the liquid working fluid in a direction toward the evaporator 22.

The condenser 26, in the example shown in FIGS. 1-3, is connected to the working fluid chamber 24 at the second end 42. The condenser 26 includes the condenser wall 46 and a condenser base 58. The condenser wall 46 projects upward from the condenser base 58 and defines a condenser cavity 60. The vaporized working fluid 28 that moves through the working fluid chamber 24 collects inside the condenser cavity 60 and condenses into the liquid phase. As can be appreciated, the condenser 26 is positioned remotely from the evaporator 22 such that the condenser 26 is not heated by the electrical component 38. Instead, the condenser 26 is subjected to a relatively cooler ambient environment. The vaporized working fluid 28 that enters the condenser 26 is cooled in the condenser cavity 60 and undergoes a phase change to the liquid phase. The condenser 26 then releases heat energy to the surrounding ambient environment.

The condenser 26, in the example shown, further includes condenser fins 62 that project outward from the condenser walls 46. The condenser fins 62 assist in conducting heat energy from the vaporized working fluid 28 to the ambient environment. The condenser fins 62, in this example, each have a curved wavy shape and are positioned parallel to one another on opposing condenser walls 46. In other examples, the condenser fins 62 can have alternate shapes and profiles.

In addition and as will be further explained below, the condenser walls 46 (and/or other walls of the thermal management device 20) can include surface textures, ribs, dimples, projections, or other features that increase the surface area of the inner surfaces. Such features enhance the heat transfer properties of the condenser 26 and improve the efficiency and rate of heat transfer of the thermal management device 20.

The condenser 26, in one example, is made of a metallic material such as copper, aluminum or the like. A metallic material is desirable due to metals' thermal conductive properties. Such material is deposited, using the additive manufacturing process, to form the condenser 26 out of the metallic material. In other examples, the condenser 26 can be integrally formed using the additive manufacturing process from two or more different materials. For example, the condenser base 58 can be made from a plastic material and the condenser walls 46 can be made from a metallic material.

Referring now to FIG. 3, the thermal management device 20 is connected to the electrical component 38. In this example, the evaporator 22 is mounted on top of the processor 36. The working fluid chamber 24 extends from the evaporator 22 between other elements of the electrical component 38 to the condenser 26 at a position away from the processor 36. In other examples, the working fluid chamber 24 can have other shapes and follow different paths from that shown in FIG. 3. Since the thermal management device 20 is formed using the additive manufacturing process, the size and shape of the evaporator 22 and/or the size and shape of the condenser 26 can be easily reconfigured to accommodate electrical components with different shapes and sizes. In addition, the working fluid chamber 24 can be reconfigured to have different shapes, paths or sizes to accommodate differing electrical components.

The thermal management device 20 is integrally formed in that the thermal management device 20 is formed as a single unit using an additive manufacturing process such as 3-dimensional (3D) printing. Such a method of manufacturing permits different areas, or the different portions, of the thermal management device 20 to be made of different materials. In addition, localized areas of the thermal management device 20 (such as the inner portion 52 of the working fluid chamber 24) have unique or complex structures that differ from surrounding areas of the thermal management device 20 without requiring complicated or multi-step manufacturing processes.

As described above, the thermal management device 20 include the volume of working fluid 28. The working fluid 28 can be any suitable fluid such as water or ammonia. As can be appreciated, the materials that are used for the other elements of the thermal management device 20 (e.g., the evaporator 22, the working fluid chamber 24 and the condenser 26) are chosen for compatibility with the working fluid 28. For example, in thermal management devices 20 in which the working fluid is water, the metallic elements of the thermal management device 20 are made of a copper material.

Referring now to FIGS. 4-9, a thermal management device 100 includes many of the same features as previously described with respect to thermal management device 20. In addition, the thermal management device 100 operates similarly as that previously described. The thermal management device 100, in this example however, has a different structure. The thermal management device 100 includes a center portion 102 and a series of working fluid chambers 104 that radiate outward from the center portion 102. In this example, the thermal management device 100 includes sixteen working fluid chambers 104 that are evenly spaced around the center portion 102. The thermal management device 100 is integrally formed as a single unit using an additive manufacturing process such as 3-dimensional (3D) printing.

Figure 4:
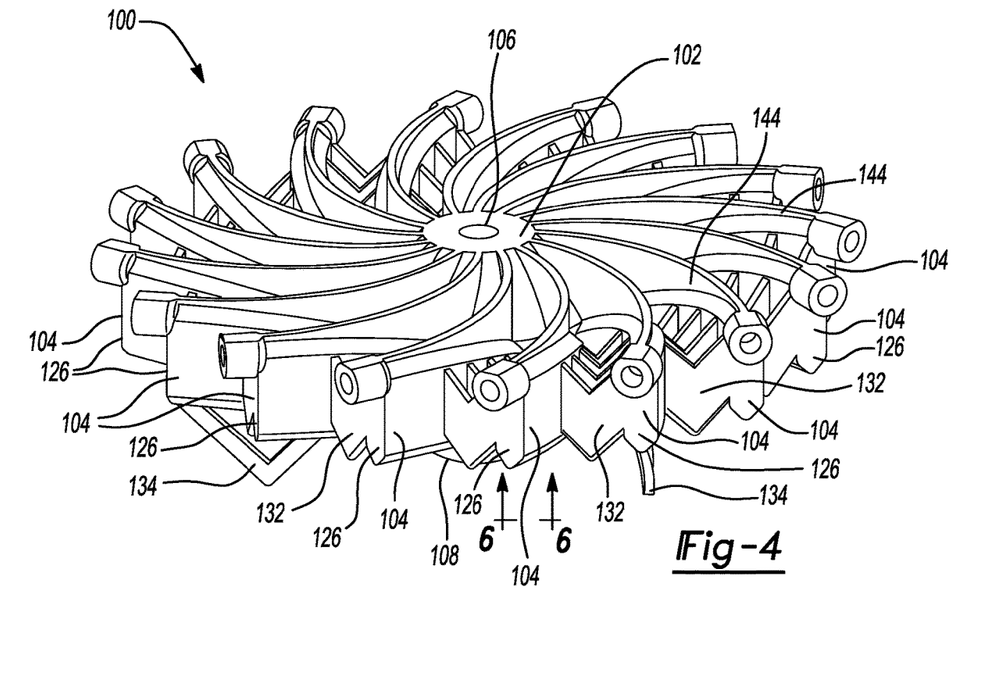
FIG. 4 is a perspective view of another example thermal management device in accordance with the present disclosure.
Figure 5:
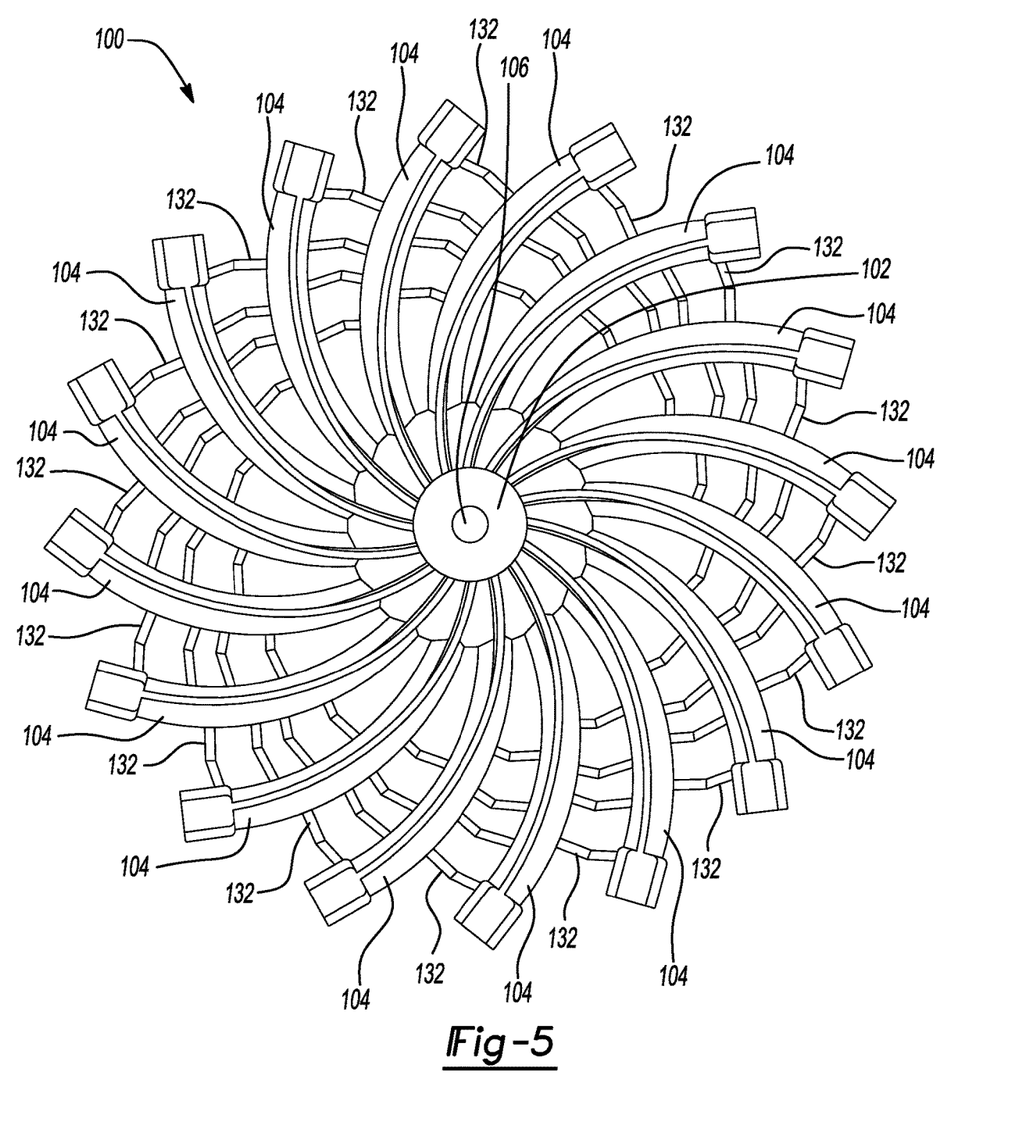
FIG. 5 is a top view of the thermal management device of FIG. 4.

The center portion 102 is positioned at the center of the thermal management device 100 and includes a center aperture 106. The center aperture 106 extends through the center portion 102 and can be received over a post to retain the thermal management device 100 in a desired position. The center portion 102, in the example shown, is hollow such that the center portion 102 can hold a volume of the working fluid 28. The center portion 102 operates as an evaporator in the thermal management device 100. The center portion 102 includes a thermally conductive base 108. The base 108 is positioned at the bottom of the thermal management device 100. As further described below, the working fluid 28, in its liquid phase, moves and/or drains into the center portion 102 and accumulates in the base 108. The base 108 is positioned adjacent to or in contact with an electrical component 138 to conduct heat from the electrical component 138 into the working fluid 28. As this occurs, the working fluid 28 undergoes a phase change and the working fluid changes from a liquid into a vapor when a sufficient amount of heat is conducted into the working fluid 28.

The center portion 102, in the example shown, is made of a metallic material such as copper or aluminum. In other examples, other suitable thermally conductive materials can also be used that enable heat from the electrical component 138 to be conducted into the working fluid via the center portion 102. In other examples, the base 108 is made of a metallic material and the remaining portions of the center portion 102 are made of a different material such as an impermeable plastic material such as acrylonitrile butadiene styrene (ABS), nylon, high-density polyethylene (HDPE), or the like. It is desirable to utilize the additive manufacturing process to form the center portion 102 of different materials due to the higher cost of metallic materials. In such examples, the portions of the center portion 102 that contact the electrical component 138 (e.g., base 108) are made of a metallic material and the other portions of the center portion 102 are made of a plastic material.

Each of the working fluid chambers 104 is hollow and follows an arcuate path as the working fluid chamber 104 extends radially outward from the center portion 102. The working fluid chambers 104 are fluidly connected with the center cavity defined by the center portion 102. In this manner, the working fluid 28 can move between the center portion 102 and each of the working fluid chambers 104.

Figures 6, 7:
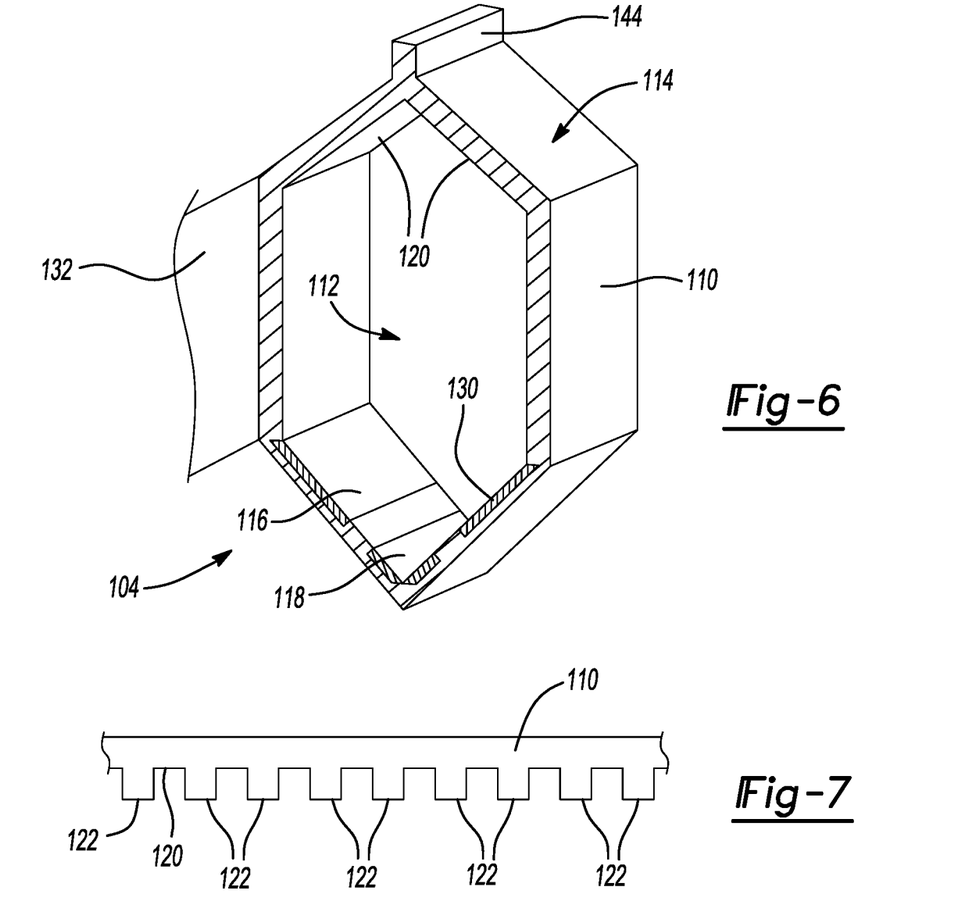
FIG. 6 is a cross-sectional view of a working fluid chamber of the thermal management device of FIG. 4.
FIG. 7 is a side view of a surface profile of a portion of the working fluid chamber of FIG. 6.

As shown in FIG. 6, each working fluid chamber 104 includes a chamber wall 110 that defines an inner cavity 112 inside the working fluid chamber 104. The chamber wall 110, in this example, has a hexagonal cross-sectional shape. The chamber wall 110 includes an impermeable layer of material and operates similarly to the outer portion 50 as previously described to retain the working fluid 28 therein. Each working fluid chamber 104 also includes a condenser portion 114, a wicking portion 116 and a funneling portion 118. The condenser portion 114, the wicking portion 116 and the funneling portion 118 are integrally formed with the other portions of the thermal management device 100 using an additive manufacturing process and, as will be described further, can be made of different materials.

The condenser portion 114 is positioned above the wicking portion 116 and the funneling portion 118. In the example shown, the condenser portion 114 has an upside down V-shape. In other examples, the condenser portion 114 can have other shapes. As can be appreciated, the condenser portion 114 is relatively cooler than other portions of the working fluid chamber 104 particularly in portions of the working fluid chamber 104 positioned radially away from the center portion 102. Since the condenser portion 114 is relatively cooler than the center portion 102, the working fluid 28 that travels radially outward from the center portion 102 (after it has changed from a liquid to a vapor) condenses back into a liquid in the condenser portion 114. The condensed working fluid 28 accumulates on the inner surfaces 120 of the condenser portion 114 and moves downward in the working fluid chamber 104 toward the wicking portion 116 and/or toward the funneling portion 118.

Figure 8:
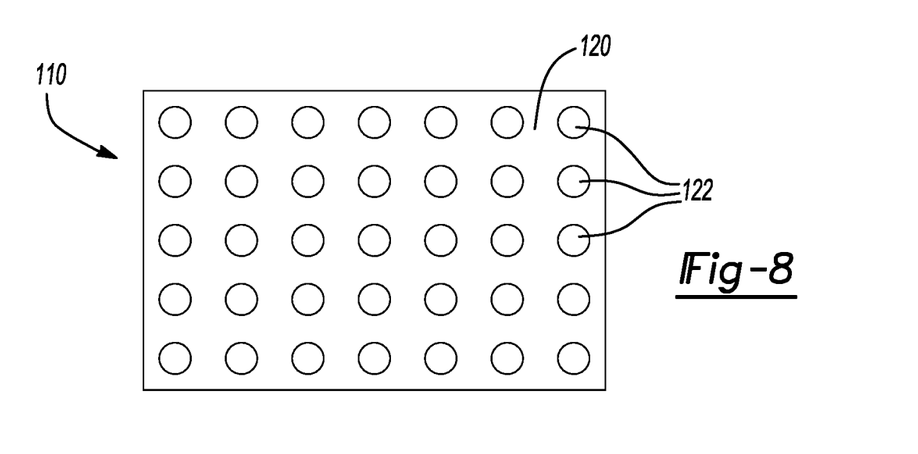
FIG. 8 is a plan view of the surface profile shown in FIG. 7.

To improve heat transfer between the working fluid 28 and the condenser portion 114, the condenser portion 114 has a surface texture with a greater surface area than that of a "smooth" surface. For example, an inner surface 120 of the condenser portion 114 includes, as shown in FIGS. 7 and 8, one or more projections 122 that project away from the inner surface 120 of the condenser portion 114 and project into the inner cavity 112. The projections 122, in the example shown, are cylindrical projections that are positioned in a series of rows on the inner surface 120. In other examples, other surface textures can be used to enhance the heat transfer from the working fluid 28 to the condenser portion 114. Such other surface textures can include dimples, ribs, blocks, grooves, fingers and the like.

In addition to the previously described surface textures, the inner surfaces of the condenser portion 114 can also include surface treatments such as coatings or other thin layers of materials. Such surface treatments are used to promote the formation of droplets of the working fluid 28 on the condenser portion 114. Such droplet formation is desirable to increase the rate at which the working fluid 28 condenses and moves back to the center portion 102 of the thermal management device 100. Example surface treatments include hydrophobic and hydrophilic materials or combinations of the two to promote the formation of droplets.

The wicking portion 116 is positioned under the condenser portion 114 in the working fluid chamber 104. The wicking portion 116 is similar to the inner portion 52 of the working fluid chamber 24 previously described. The wicking portion 116, in this example, is a region of the working fluid chamber 104 integrally formed in the chamber wall 110 that has a structure that moves liquid working fluid 28 toward the center portion 102. The wicking portion 116, as shown in FIG. 6, is positioned in the chamber wall 110 on a lower angled wall of the working fluid chamber 104. The wicking portion 116 extends longitudinally along the length of the working fluid chamber 104 from distal ends 126 (FIG. 4) of the working fluid chambers 104 to the center portion 102. The working fluid chambers 104 also include a second wicking portion 130 on a lower angled wall on an opposite side of the working fluid chamber 104 as shown. The second wicking portion 130 also extends longitudinally along the length of the working fluid chamber 104 from the distal end 126 to the center portion 102. In other examples, the wicking portion 116 and/or the second wicking portion 130 is integrally formed in other locations or in more portions of the chamber wall 110.

The wicking portion 116 and the second wicking portion 130 are made of a porous material and/or are formed with one or more pores or channels that cause the liquid working fluid 28 to move toward the center portion 102 due to capillary pressure and/or due to the wicking properties of the porous material. For example, the wicking portion 116 can be made of a plastic material or a sintered metallic material. Such porous plastic materials include ultra-high molecular weight polyethylene (UHMWPE), high-density polyethylene (HDPE), polypropylene (PP), polytetrafluoroethylene (PTFE), and polyvinylidene fluoride (PVDF). In other examples, other suitable porous materials can be used.

The funneling portion 118 is also integrally formed in the chamber wall 110 of the working fluid chamber 104. In the example shown, the funneling portion 118 is positioned at the base of the lower V-shape of the working fluid chamber 104. The funneling portion 118 extends from the distal ends 126 of the working fluid chambers 104 to the center portion 102. The working fluid chambers 104, and the funneling portions 118 thereof, are angled downward as the working fluid chambers 104 extend toward the center portion 102. As such, the distal ends 126 of the working fluid chambers 104 are positioned vertically higher than opposite ends of the working fluid chambers 104 that are joined to the center portion 102. In this configuration, gravity causes the liquid working fluid 28 that condenses in the working fluid chambers 104 and collects in the funneling portion 118 to be guided back toward the center portion 102.

As can be appreciated, the liquid working fluid 28 that condenses inside the condenser portion 114 collects on the inner surfaces of the chamber wall 110 and moves downward toward the V-shaped funneling portion 118 and the wicking portion 116. Some of this liquid working fluid 28 is wicked toward the center portion 102 by the wicking portion 116. Some of this liquid working fluid 28 collects in the funneling portion 118. The funneling portion 118 guides the liquid working fluid 28 toward the center portion 102.

The funneling portion 118, in the example shown, is made of a material that exhibits a low resistance to the flow of the working fluid 28. Such a material can have water-resistant and low-viscosity properties. In one example, a low porosity thermoplastic material is used. In other examples, a suitable nylon material or other material can be used.

The thermal management device 100 also includes fins 132 that connect the distal ends 126 of adjacent working fluid chambers 104. The fins 132 have a chevron shape and with edges that are angled at approximately 45 degrees from a horizontal plane. The fins 132 support the working fluid chambers 104 and assist in maintaining the structure of the thermal management device 100 when the thermal management device 100 is being formed using a 3-dimensional printing process. In addition to providing structural support, the fins 132 also increase the surface area of the thermal management device 100 at or near the condenser portions 114. The fins 132 further enhance the transfer of heat from the working fluid 28 inside the condenser portions 114 to the ambient environment.

The thermal management device 100, in the example shown, also includes one or more ribs 144. The ribs 144 extend along a top surface of each working fluid chamber 104. The ribs 144, in the example shown, are vertical walls that project upward from the apex of the working fluid chambers 104. Each of the ribs 144 has a curved shape that follows the shape of the working fluid chamber 104. The ribs 144 provide structural support to the thermal management device 100. In addition, the ribs 144 are mounted to the condenser portions 114 of the working fluid chambers 104 and provide additional surface area to the working fluid chambers 104 to enable heat from the working fluid vapor to be conducted to the ambient environment. In the example shown, one rib 144 extends from the center portion 102 to the distal end 126 of each working fluid chamber 104. In other examples, each working fluid chamber 104 can include more than one rib 144.

The thermal management device 100, in the example shown, also includes one or more legs 134 that project downward from the lower surfaces of the working fluid chambers 104. In this example, the thermal management device 100 includes four legs (only two are shown) that project downward to provide a support structure for the thermal management device 100. The bottom of the legs 134 are aligned in a horizontal plane with the base 108 of the center portion 102. As such, the thermal management device 100 is stable when it is positioned on a horizontal surface because the thermal management device 100 rests on the base 108 and on the legs 134. When positioned on a horizontal surface of an electrical component 138, the legs 134 maintain a gap between the working fluid chambers 104 and the horizontal surface of the electrical component 138. In such a position, the working fluid chambers 104 are not in direct thermal communication with the electrical component.

Figure 9:
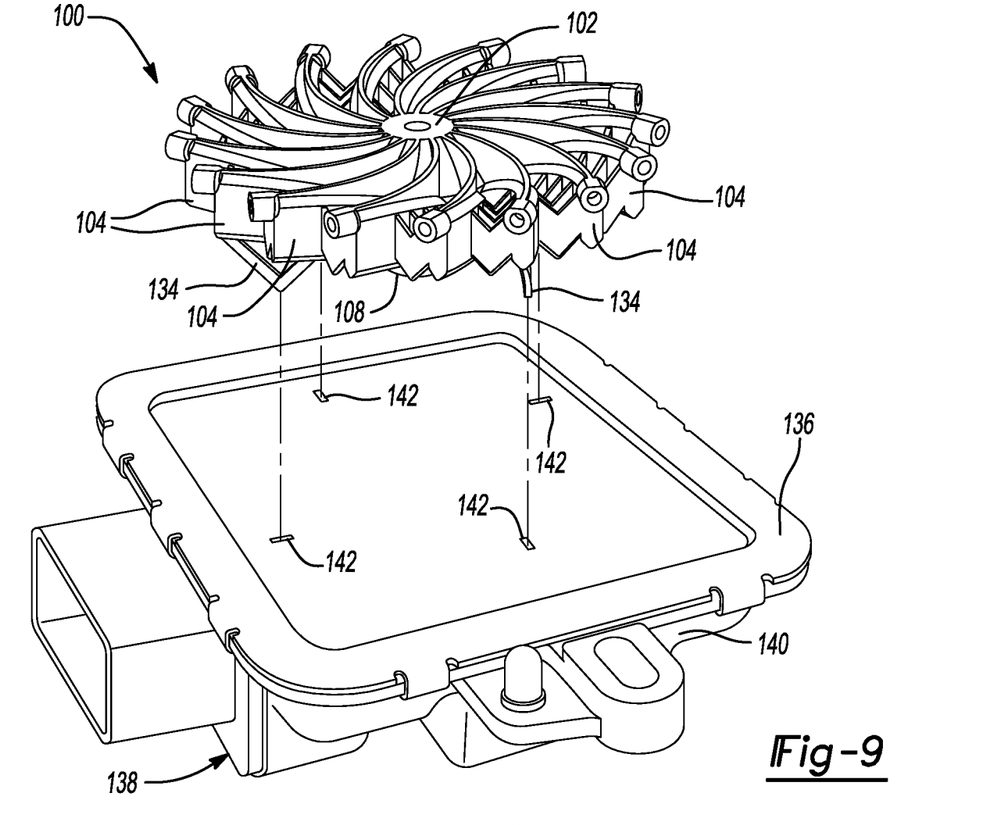
FIG. 9 is a partially-exploded view of the thermal management device of FIG. 4 connected to an electrical component.

Referring now to FIG. 9, the thermal management device 100, in one example, is attached to a cover 136 of the electrical component 138. In the example shown, the cover 136 encloses a housing 140 of the electrical component 138. The thermal management device 100 is removably attached to the cover 136. As shown, the cover 136 includes four slots 142 that are positioned in a top surface of the cover 136. The slots 142 are sized and positioned to accept the legs 134 of the thermal management device 100. The legs 134 can include tabs, fingers, hooks, barbs or other similar attachment structures that can secure the legs 134 relative to the cover 136 when the legs 134 are inserted into the slots 142. In other examples, the thermal management device 100 can include other attachment features or can be connected to the electrical component 138 using fasteners, adhesive, or other suitable attachments.

Figure 10:
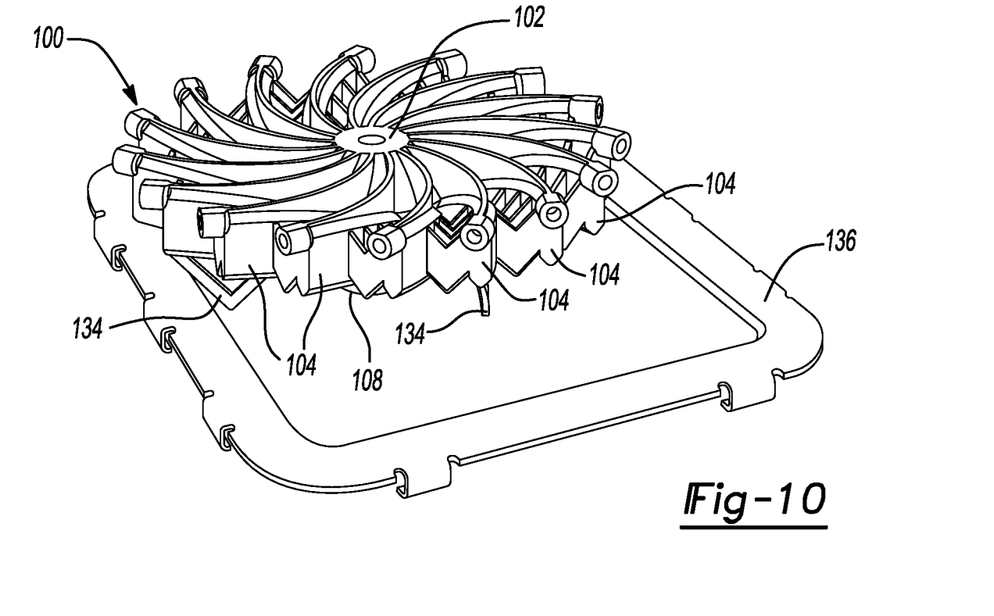
FIG. 10 is a perspective view of the thermal management device of FIG. 4 formed as part of a cover of an electrical component.

In the example shown in FIG. 10, the thermal management device 100 is integrally formed with the cover 136 of the electrical component 138. Since the thermal management device 100 is formed using an additive manufacturing process, the cover 136 is formed with the thermal management device 100. In the example shown, the cover 136 is formed using a metallic material and the thermal management device 100 is formed from the materials previously described. In other examples, other materials can be used.

As can be appreciated, the thermal management device 100 is positioned on the cover 136 to enable the heat that is generated by one or more electrical elements such as power supplies, processors, electric motors or the like to be transmitted through the cover 136 to the thermal management device 100. The base 108 of the thermal management device 100 is positioned in contact with the cover 136. The base 108 conducts heat into the working fluid 28 through the center portion 102. When the heat is sufficient, the working fluid changes from a liquid to a vapor. The vaporized working fluid 28 moves from the center portion 102 outward through the working fluid chambers 104. The vaporized working fluid 28 changes from a vapor back to a liquid in the condenser portions 114 of the working fluid chambers 104. The liquid working fluid 28 moves back to the center portion 102 through the wicking portions 116 and/or via the funneling portions 118.

The previously described movement of the working fluid 28 through the thermal management device 100 efficiently and effectively dissipates heat from the electrical component 138. Since the heat generated by the electrical component 138 is dissipated, the electrical component 138 can be operated with greater power loads than would otherwise not be possible for similarly sized electrical components 138 that are not equipped with the thermal management device 100. Alternatively, smaller electrical components 138 can be operated at the same power levels as larger electrical components 138 if the smaller-sized electrical components 138 are equipped with the thermal management device 100.

Figure 11:
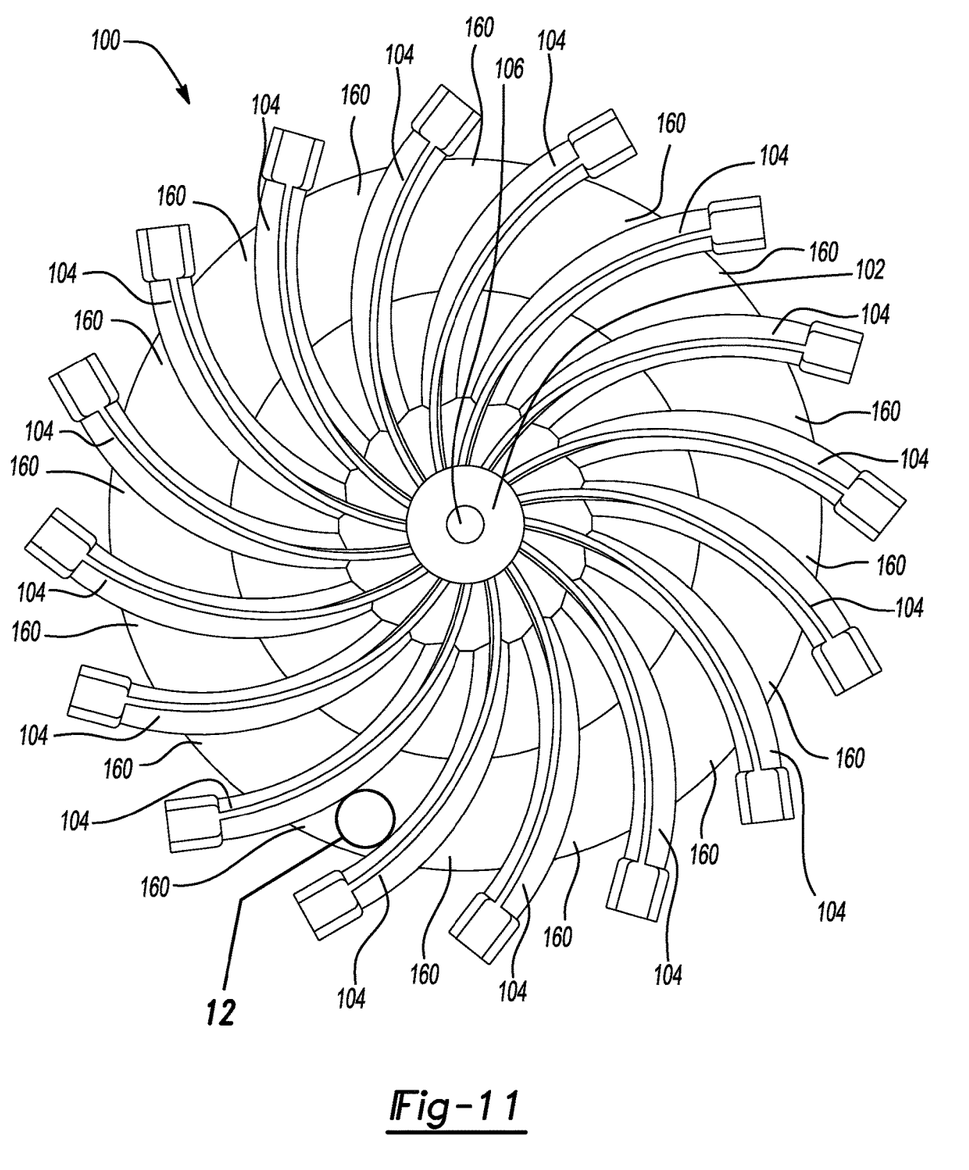
FIG. 11 is a top view of another example thermal management device in accordance with the present disclosure.

As shown in FIG. 11, the thermal management device 100, in another example, has a connecting ring 160 in place of the fins 132 previously described. The thermal management device 100, in this example, includes the same structure as previously described with the working fluid chambers 104 extending from the center portion 102. In this example, however, the connecting ring 160 extends between each of the working fluid chambers 104. When viewed from above, the connecting ring 160 is an annular-shaped member that connects each of the working fluid chambers 104 to adjacent working fluid chambers 104. The connecting ring 160 supports the working fluid chambers 104 and also increases the surface area of the thermal management device 100 to enhance the transfer of heat from the working fluid 28 through the condenser portion 114 to the environment.

Figure 12:
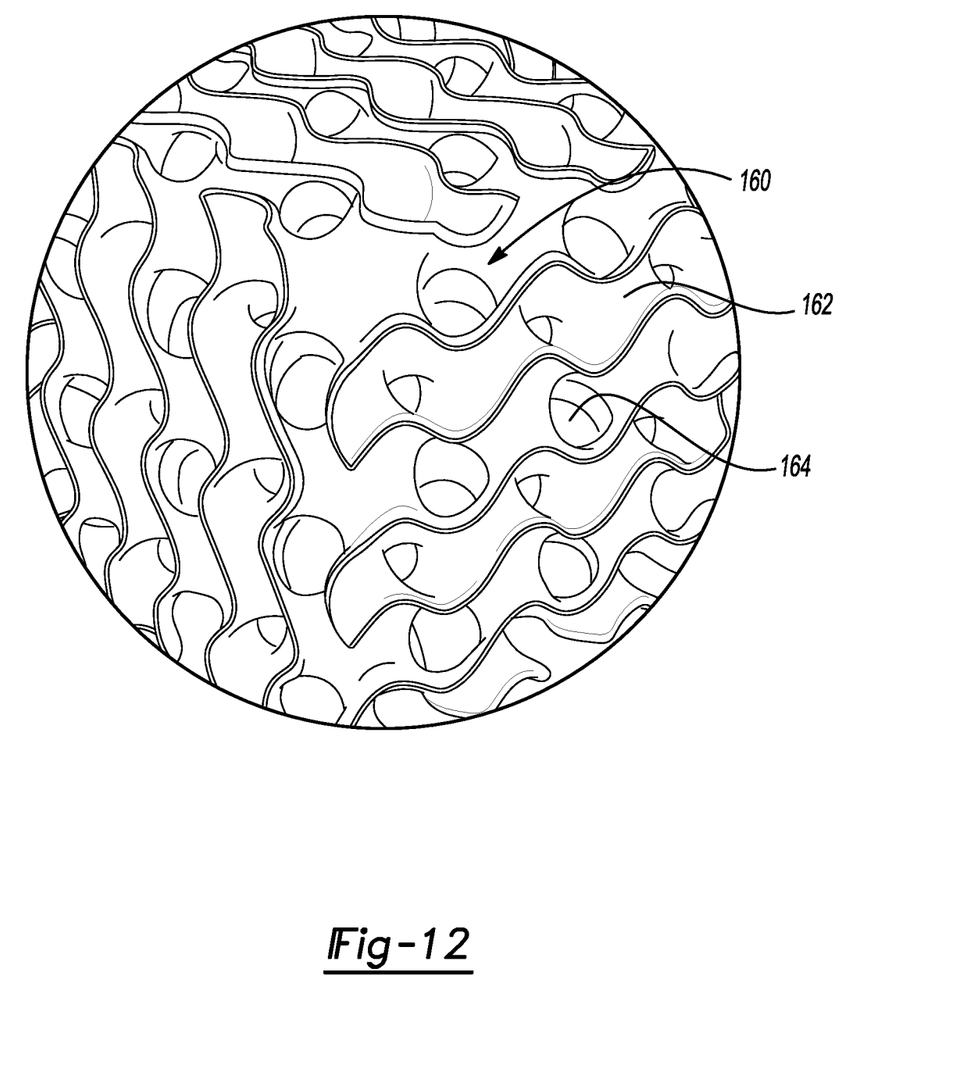
FIG. 12 is a magnified view showing the structure of the connecting ring of the thermal management device of FIG. 11.

In the example shown, the connecting ring 160 has a gyroid structure. As shown in FIG. 12, the gyroid structure of the connecting ring 160 includes multiple curved connecting walls 162. The connecting walls 162 define multiple channels 164 through the gyroid structure. As can be appreciated, the gyroid structure increases the surface area of the connecting ring 160 to enhance heat transfer while providing structural support to the thermal management device 100. In other examples, the connecting ring 160 can have other structures such as concentric annular fins, arcuate parallel fins or the like.

Figure 13:
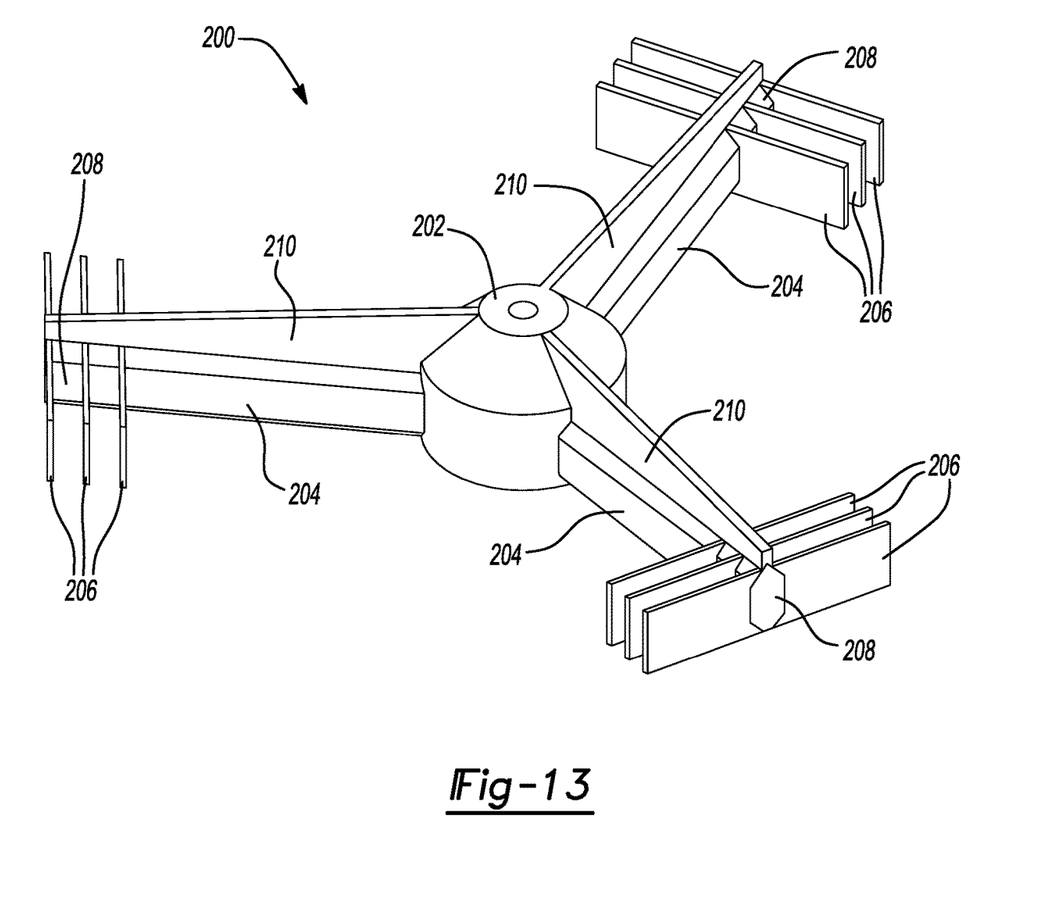
FIG. 13 is a perspective view of another example thermal management device in accordance with the present disclosure.

Referring now to FIG. 13, another example thermal management device 200 includes a center portion 202 and three working fluid chambers 204. The thermal management device 200 includes many features that are similar to the thermal management device 100 previously described. The center portion 202, in the example shown, is a hollow structure that holds a volume of working fluid 28. The working fluid chambers 204 extend radially outward from the center portion 202. The working fluid chambers 204 are hollow and are fluidly connected to the center portion 202.

While not shown in this example, the working fluid chambers 204 have a cross-section similar to that shown in FIG. 6. The working fluid chambers 204 include the condenser portions 114, wicking portions 116 and funneling portions 118 previously described. The thermal management device 200 also includes fins 206 positioned at distal ends 208 of the working fluid chambers 204. The fins 206 are connected to the working fluid chambers 204 and assist in cooling the working fluid chambers 204 to condense vaporized working fluid 28 that moves from the center portion 202 toward the distal ends 208 of the working fluid chambers 204. The thermal management device 200 also includes three ribs 210. The ribs 210 are each positioned on a top portion of the working fluid chambers 204 and extend radially outward from the center portion 202. The ribs 210 support the working fluid chambers 204 and stiffen the structure of the thermal management device 200. The ribs 210 also provide additional surface area to the thermal management device 200 to further dissipate heat from an electrical component.

The thermal management device 200 is made of materials similar to that previously described with respect to thermal management devices 20 and 100. In addition, the thermal management device 200 is integrally formed using an additive manufacturing process from one or more materials. The thermal management device 200 is formed, alternatively, with attachments structures to connect the thermal management device 200 to an electrical component or is integrally formed as part of the electrical component or the housing or cover thereof.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

What is claimed is:

1. A thermal management device for dissipating heat from an electrical component, the thermal management device comprising:
   a volume of working fluid configured to change from a liquid state to a vapor state in response to being heated by the electrical component; and
   a working fluid chamber configured to move the working fluid, the working fluid chamber including:
      an impermeable outer portion; and
      a porous inner portion integrally formed with and connected to the impermeable outer portion, the porous inner portion configured to move the working fluid when in the liquid state toward the electrical component,
   wherein
      the impermeable outer portion is made of a first material and the porous inner portion is made of a second material, the first material different from the second material, and
      at least one of
         the working fluid chamber radiates outward from a circular center portion,
         the working fluid chamber comprises a rib extending outward from the working fluid chamber to stiffen the working fluid chamber, or
         the working fluid chamber is integrally formed with a cover of a housing of the electrical component.

2. The thermal management device of claim 1, comprising an evaporator connected to the working fluid chamber, at least a portion of the evaporator formed from a thermally conductive material with greater thermal conductivity than the first material and configured to thermally conduct heat from the electrical component to the working fluid.

3. The thermal management device of claim 2, wherein the evaporator includes an evaporator wall defining an evaporator cavity and the evaporator cavity is in fluid communication with the working fluid chamber.

4. The thermal management device of claim 3, wherein the thermally conductive material is a different material than the first material and the second material.

5. The thermal management device of claim 3, wherein the working fluid chamber extends away from the evaporator.

6. The thermal management device of claim 2, comprising a condenser, the condenser integrally formed with and connected to the working fluid chamber and configured to transfer heat from the working fluid to an environment.

7. The thermal management device of claim 1, wherein the working fluid chamber has an arcuate shape radiating outward from the circular center portion.

8. The thermal management device of claim 1, comprising a plurality of working fluid chambers including the working fluid chamber configured to move the working fluid, wherein each working fluid chamber of the plurality of working fluid chambers includes:
   an impermeable outer portion including an inner surface that defines at least a portion of an inner cavity inside the working fluid chamber; and
   a porous inner portion integrally formed with and connected to the impermeable outer portion, the porous inner portion configured to move the working fluid when in the liquid state toward a thermally conductive evaporator.

9. The thermal management device of claim 8, wherein each working fluid chamber of the plurality of working fluid chambers has an arcuate shape and radiates outward from the circular center portion.

10. The thermal management device of claim 9, further comprising a plurality of connecting surfaces that are connected between the plurality of working fluid chambers.

11. The thermal management device of claim 10, wherein the plurality of connecting fins are integrally formed with the plurality of working fluid chambers.

12. The thermal management device of claim 8, wherein each working fluid chamber of the plurality of working fluid chambers has a linear shape and radiates outward from the circular center portion.

13. The thermal management device of claim 8, further comprising a plurality of ribs, wherein each rib of the plurality of ribs is associated with one working fluid chamber of the plurality of working fluid chambers and projects upward from a top surface of the working fluid chamber, the plurality of ribs configured to stiffen the plurality of working fluid chambers.

14. The thermal management device of claim 1, comprising at least one support leg connected to the working fluid chamber, the at least one support leg configured to connect the thermal management device to the cover of the housing of the electrical component.

15. The thermal management device of claim 1, wherein the working fluid chamber is integrally formed with the cover of the housing of the electrical component.

16. A thermal management device for dissipating heat from an electrical component, the thermal management device comprising:
   a volume of working fluid configured to change from a liquid state to a vapor state in response to being heated by the electrical component;

a working fluid chamber configured to move the working fluid, the working fluid chamber including:
an impermeable outer portion; and
a porous inner portion integrally formed with and connected to the impermeable outer portion, the porous inner portion configured to move the working fluid when in the liquid state toward the electrical component; and
a condenser, the condenser integrally formed with and connected to the working fluid chamber and configured to transfer heat from the working fluid to an environment,
wherein
the impermeable outer portion is made of a first material and the porous inner portion is made of a second material, the first material different from the second material, and
the condenser includes a condenser wall in contact with the working fluid, the condenser wall including a plurality of projections in contact with the working fluid, the plurality of projections configured to increase a rate at which the working fluid condenses from the vapor state to the liquid state when the working fluid contacts the plurality of projections.

17. A thermal management device for dissipating heat from an electrical component of a vehicle, the thermal management device comprising:
a center portion configured to hold a volume of working fluid and to conduct heat from the electrical component into the working fluid; and
a plurality of working fluid chambers projecting radially outward away from a center point of the center portion, the plurality of working fluid chambers each including:
a funneling surface angled downwardly toward the center portion to cause the working fluid to flow toward the center portion after the working fluid condensates into a liquid in the plurality of working fluid chambers; and
a porous wicking portion positioned inside each working fluid chamber, the porous wicking portion configured to cause the working fluid to move toward the center portion after the working fluid condensates into the liquid in the working fluid chamber,
wherein the funneling surface and the porous wicking portion are integrally formed in one or more walls of each working fluid chamber of the plurality of working fluid chambers and are made of different materials.

18. The thermal management device of claim 17, wherein at least part of the center portion is made of a metallic material and is integrally formed with the plurality of working fluid chambers.

19. The thermal management device of claim 17, wherein the porous wicking portion is made of a material that includes a plurality of channels therein that wick the working fluid toward the center portion.

20. The thermal management device of claim 17, comprising a plurality of fins connected to a distal end of each working fluid chamber of the plurality of working fluid chambers, the distal end of each working fluid chamber located at an end of the working fluid chamber away from the center portion.

* * * * *